United States Patent [19]
Thebault et al.

[11] Patent Number: 5,217,755
[45] Date of Patent: Jun. 8, 1993

[54] CHEMICAL VAPOR INFILTRATION METHOD UTILIZING SUBSTANTIALLY DIFFUSIVE CONDITIONS

[75] Inventors: Jacques Thebault, Bordeaux; Jean L. Domblides, Bruges; Lionel Vandenbulcke, Saint Jean le Blanc, all of France

[73] Assignee: Societe Europeenne de Propulsion, Suresnes, France

[21] Appl. No.: 808,624

[22] Filed: Dec. 16, 1991

[30] Foreign Application Priority Data

Dec. 18, 1990 [FR] France .................. 90 15858

[51] Int. Cl.⁵ .................. C23C 8/06; C23C 16/00; C23G 16/54
[52] U.S. Cl. .................. 427/248.1; 427/249; 118/715; 118/719; 118/725
[58] Field of Search .................. 427/248.1, 249; 118/715, 719, 725

[56] References Cited

U.S. PATENT DOCUMENTS

| | | | |
|---|---|---|---|
| 4,825,809 | 5/1989 | Mieno | 118/725 |
| 4,837,054 | 6/1989 | Schucker | 427/244 |
| 4,854,263 | 8/1989 | Chang et al. | 118/715 |
| 4,901,667 | 2/1990 | Suzuki et al. | 118/719 |
| 4,913,090 | 4/1990 | Harada et al. | 118/719 |

*Primary Examiner*—Shrive Beck
*Assistant Examiner*—Bret Chen
*Attorney, Agent, or Firm*—Weingarten, Schurgin, Gagnebin & Hayes

[57] ABSTRACT

A porous substrate is placed inside an enclosure and a gas flow is injected into the enclosure under predetermined conditions of temperature and pressure to form a solid deposit within the accessible pores inside the substrate. A wall that is permeable to the gas flow is interposed on the path of the flow between its inlet into the enclosure and the substrate, the wall not being in contact with the substrate, thereby forming around the substrate a region which is free from strong turbulence so that infiltration is performed essentially under diffusion conditions, thereby minimizing the deposition gradient within the volume of the substrate.

6 Claims, 3 Drawing Sheets

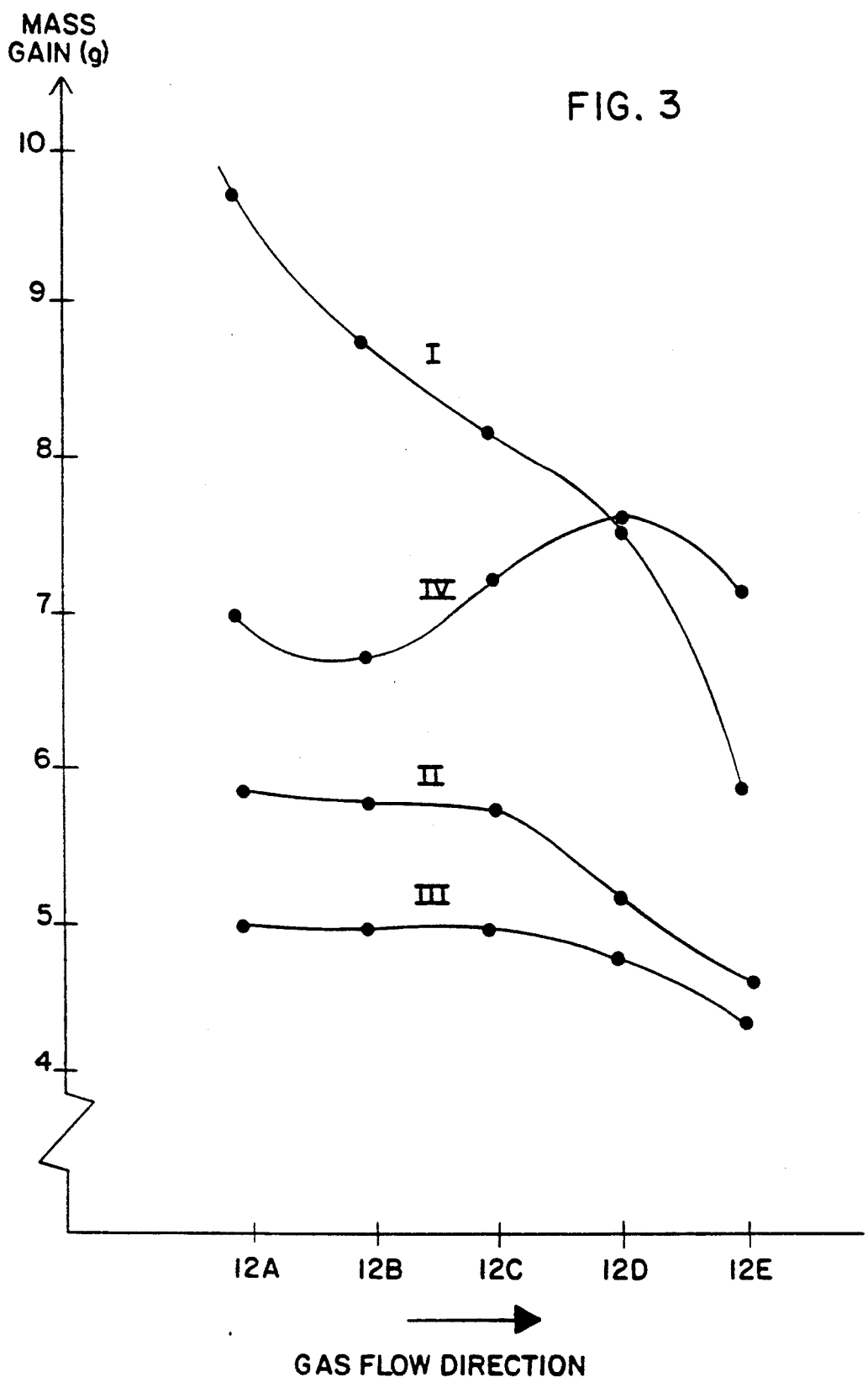

CHEMICAL VAPOR INFILTRATION METHOD UTILIZING SUBSTANTIALLY DIFFUSIVE CONDITIONS

The present invention relates to a chemical vapor infiltration method, in particular a method of the type in which at least one porous substrate is disposed in an enclosure and a flow of gas is injected into the enclosure under predetermined conditions of temperature and pressure to densify the accessible pores within the substrate, and throughout the volume of the substrate.

BACKGROUND OF THE INVENTION

A particular field of application of the invention is making composite material parts constituted by a fiber preform which is densified by a matrix by chemical vapor infiltration. The preform or substrate is a texture or fabric formed on the basis of fibers, e.g. a cloth or a felt. In order to enable the matrix-constituting material to infiltrate into the core of the preform, the preform is placed in an oven at a predetermined temperature and a flow of gas is injected into the enclosure under predetermined conditions of pressure and flow rate. The matrix material is obtained by one of the components in the flow of gas decomposing or by a plurality of components in the flow of gas reacting on coming into contact with the preform. Chemical vapor infiltration methods using carbon or ceramics (carbides, nitrides, or refractory oxides, for example) are well known. Reference may be made, in particular, to the following documents: FR-A-2 189 207, FR-A-2 401 888, and EP 0 085 601.

Chemical vapor infiltration is a lengthy process (several tens of hours) and it is often performed in a plurality of successive cycles.

A drawback of the chemical vapor infiltration methods currently in use lies in a deposition gradient of the matrix-constituting material within the substrate. More precisely, the thickness of the deposit falls off perceptibly between the surface of the substrate and the interior of the substrate, and the greater the speed of infiltration, the greater this effect.

Because of this "excess deposition" on the surface, the pores in the substrate end up by being closed at the surface long before the core has been completely densified.

It is then frequently necessary to machine the substrate to give the flow of gas new access to the internal pores thereof. To do this, the incompletely densified part must be allowed to cool so that it can be removed from the furnace, and so that the surface deposit can be removed by machining, prior to returning the part to the furnace and bringing it back up to the desired temperature. Operations of infiltration followed by machining are commonly repeated several times before the desired degree of densification is achieved.

Nevertheless, in the end, densification is inevitably greater in the vicinity of the surface than in the core of the substrate where residual pores remain.

In addition, the surface deposit that results from the impact of the gas flow on the substrate sometimes presents a microstructure or crystallinity that is different from that of the deposit in the core of the substrate.

Thus, an object of the present invention is to provide a method whereby the deposition gradient can be minimized, thereby making it possible to achieve densification that is more uniform, more regular, and more complete.

SUMMARY OF THE INVENTION

This object is achieved by means of a method such as that defined at the beginning of the present description and whereby, according to the invention, at least one wall that is permeable to the gas flow is interposed on the path thereof between its admission into the enclosure and the substrate, the wall not being in contact with the substrate, thereby establishing around the substrate a region that is essentially under diffusion conditions.

Interposing the permeable wall protects the surface of the substrate from the aerodynamic impact of the gas flow which is a source of "excess deposit" on the surface, and it establishes a region of "calm" around the substrate in which there is no strong turbulence. Infiltration then takes place essentially under diffusion conditions which are favorable for forming a deposit that is uniform and regular throughout the volume and on the surface of the substrate.

The permeable wall may be constituted by a non-rigid fiber texture, e.g. a cloth or a felt that may optionally be perforated, or it may be constituted by a rigid structure such as a solid envelope pierced by orifices, for example.

The wall must be sufficiently permeable to enable the gas in the vicinity of the substrate to be renewed and to evacuate reaction products, while nevertheless being effective in performing its role as a barrier to strong aerodynamic interactions between the gas flow and the substrate, which interactions occur even under conditions of laminar flow.

The material from which the permeable wall is made must be capable of withstanding the temperature and pressure conditions within the enclosure without deteriorating and it must be compatible with the substances present (the injected gas flow and the reaction products). In most cases, the permeable wall may be made of carbon (carbon felt or cloth) or of graphite (a rigid perforated graphite envelope). However, other refractory materials may be used, for example such as ceramics, or metals in fiber or rigid form.

The method of the invention can be used regardless of the nature of the material being deposited. In particular, the material being deposited may be a pyrocarbon or a ceramic, e.g. silicon carbide or boron nitride.

By obtaining a substantial reduction in the deposition thickness gradient, the method of the invention makes it possible to perform longer uninterrupted filtration cycles, thereby reducing the number of machining operations, and may even avoid the need for any such operations. The "excess deposit" is produced on the permeable wall against which the gas flow comes into contact. The permeability of the wall is selected to be greater than that of the substrate. The permeable wall preferably offers the gas a flow section which is several times (at least two or three times) greater than that present at the surface of the substrate. As a result, infiltration can be continued long after the surface pores in the substrate would have been closed up in the absence of the permeable wall. When the "excess deposit" on the permeable wall become too great, it can be changed.

The method of the invention offers a particular advantage when the substrate is very thick. It is under such circumstances that the drawback constituted by the deposition thickness gradient is most troublesome with prior art methods.

It will also be observed that the method of the invention makes it possible to form a deposit having the same quality (same crystal microstructure) throughout the substrate, since the same diffusion conditions exist for the gas flow not only within the substrate but also in the vicinity of its outside surface.

BRIEF DESCRIPTION OF THE DRAWINGS

Implementations of the invention are described below by way of non-limiting example.

Reference is made to the accompanying drawings, in which:

FIG. 3 is a graph showing curves representative of deposition weight (thickness) gradients obtained using methods of the invention and a prior art method.

DETAILED DESCRIPTION

Figure 1:
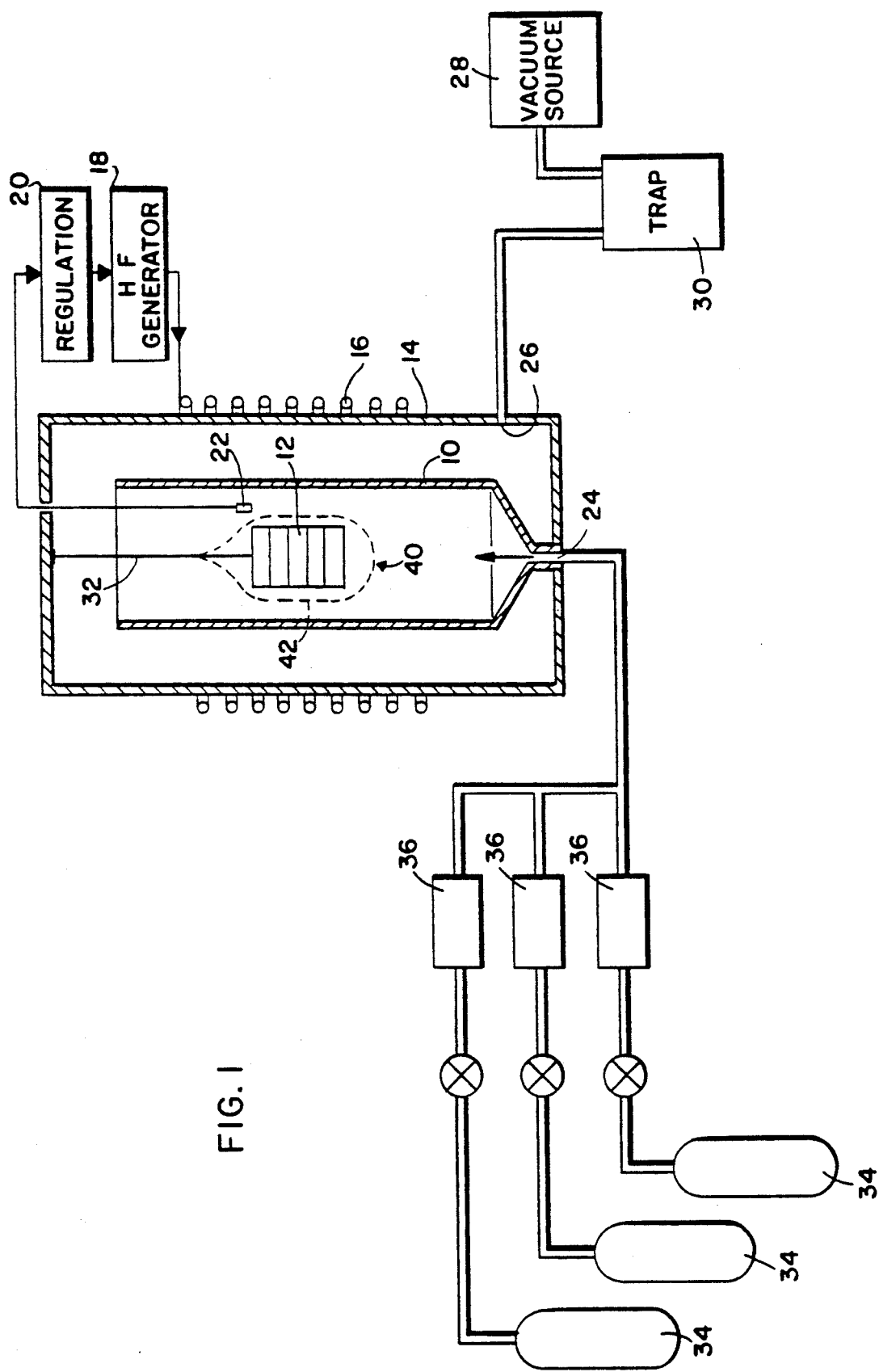
FIG. 1 is a diagrammatic view of an installation for performing the method of the invention.
Figure 2:
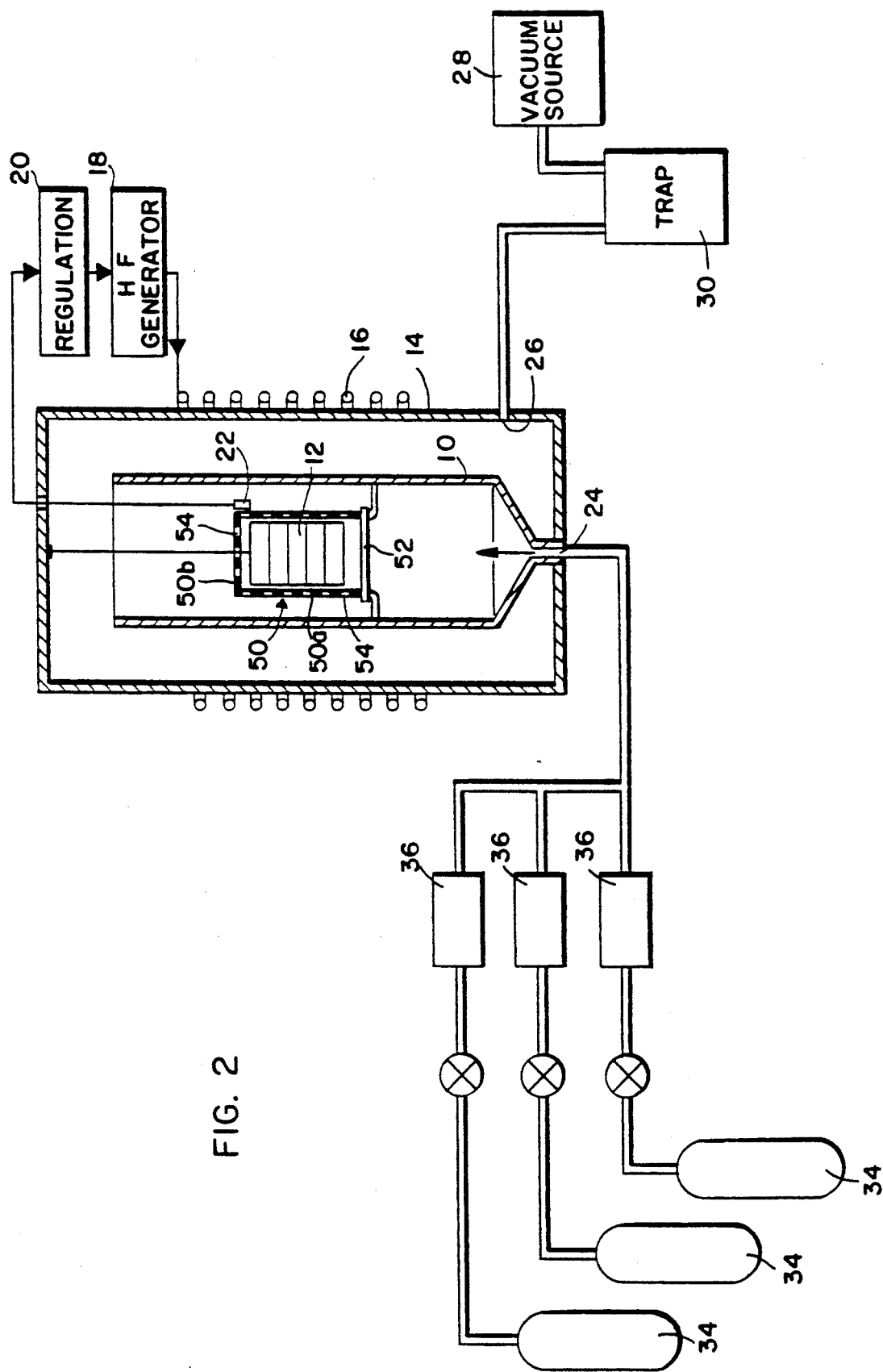
FIG. 2 is a diagrammatic view of a variant of the FIG. 1 installation.

FIGS. 1 and 2 show chemical vapor infiltration installations comprising a susceptor 10 having one or more porous substrates 12 to be densified placed therein. The susceptor 10 which may be made of graphite, for example, is received in a chamber 14 which has an inductor 16 disposed thereabout. A high frequency generator 18 powers the inductor 16 to heat the susceptor 10 by induction. A regulator circuit 20 receives a signal from a temperature sensor 22 situated inside the enclosure, and it controls the generator 18 to maintain the temperature in the susceptor at a desired value.

In the example shown, the gas flow is admitted into the susceptor 10 via its base through an inlet 24, and it flows vertically upwards, with the top of the susceptor opening into the chamber 14. The residual gases are extracted from the chamber 14 via an outlet 26 connected to a vacuum source 28 so as to establish the desired low pressure inside the susceptor. A liquid nitrogen trap 30 is placed on the path followed by the gases between the outlet 26 and the vacuum source 28, and enables the substances extracted from the chamber 14 to be condensed.

The porous substrate(s) 12 to be densified are held in the susceptor 10 by being placed on an appropriate support device, or else, as in the example shown, by being suspended by one or more wires 32, e.g. tungsten wires.

Infiltration installations as described above are known. They further include gas sources 34 and flow meters 36 for making up the gas flow and feeding the enclosure at the desired rate.

According to the invention, a wall that is permeable to the gas flow is interposed inside the susceptor 10 between the inlet 24 and the porous substrate(s) 12 to be densified.

In the example of FIG. 1, the permeable wall is a cloth envelope 40 which is closed like a bag, surrounding the porous substrate(s) 12 and held apart therefrom. The envelope 40 receives the aerodynamic impact of the gas flow and allows the gas to pass through while establishing a region of "calm" around the porous substrate(s) 12 enabling infiltration to take place under diffusion conditions.

The cloth constituting the envelope 40 may be carbon cloth, for example. It presents greater permeability to the gases than the porous substrate(s) 12. To this end, holes 42 may be made through the cloth. To ensure that the envelope 40 continues to be an effective barrier against the dynamics and the turbulence of the gas flow, the holes 42 are relatively small in diameter, e.g. about 1 millimeter.

In a variant, the flexible envelope 40 may be made of a texture other than cloth, e.g. it may be a felt. The material constituting the envelope may be other than carbon, providing it is not damaged by the temperature and pressure conditions that exist during infiltration. For example, a ceramic or a refractory metal may be selected that is chemically neutral relative to the gas flow and to the reaction products thereof.

In the example of FIG. 2, the porous substrates are inside a rigid cylindrical envelope constituting a bell 50 standing on a tray 52, both being made of graphite, for example. The bell 50 constitutes a permeable wall because of holes 54 formed through its side wall 50a, and through its top wall 50b. As in the preceding example, the size of the holes 54 and the number thereof are determined to confer the desired permeability on the envelope 50. By having no holes in the tray 52 facing the incoming gas flow, and by forming holes solely in the side wall 50a parallel to the direction of incidence of the gas flow, and also in the top wall 50b, the already greatly attenuated impact effect that the gas flow may have on the porous substrate(s) 12 is further reduced, thereby further reducing any possible deposition thickness gradient.

It is possible to make a permeable wall that has a permeability gradient, with its permeability increasing in the gas flow direction. In the example of FIG. 2, this may be achieved by increasing the number and/or the diameter of the holes 54 on going from the tray 52 to the top wall 50b, which may itself be omitted. Holes could also be formed through the tray 52 to confer a minimum degree of permeability thereto.

EXAMPLE 1

Tests have been performed using an installation as shown in FIG. 1 with porous substrates 12 constituted by five identical felt disks having a diameter of 40 mm and a thickness of 8 mm, the disks being stacked along a common vertical axis parallel to the direction of incidence of the gas flow. The disks 12 were made of carbon felt with a fiber volume percentage of about 8% (i.e. about 8% of the volume of the felt is actually occupied by the fibers).

During each test, the porous substrates 12 were densified by pyrocarbon obtained by decomposing natural gas. Infiltration was continued for 35 hours and at a pressure of 20 torr ($2.7 \times 10^3$ N/m$^2$).

Four tests were performed, the first was a control with no permeable wall being disposed around the felt disks, i.e. it was performed by the prior art method. The second test was performed by placing the felt disks inside a flexible envelope made of cloth similar to the envelope 40 shown in FIG. 1. The cloth was a carbon cloth sold under reference G 801 by the French firm Brochier. This cloth is relatively loose, with the warp threads and the weft threads leaving openings with a flow section of about 0.2 mm$^2$, thus conferring a porosity per unit area of about 16% to the cloth. The third test was performed by placing the felt disks inside a rigid envelope such as the envelope 50 in FIG. 2, and provided with perforations through its side wall 50a only, and the fourth test was performed by placing the felt disks inside an identical rigid envelope, but having perforations both through its side wall 50a and through its cover 50b.

During the first, second, and third tests infiltration was performed at a temperature of about 1000° C., and during the fourth test, the temperature was about 1050° C.

At the end of each test, the mass gain of each disk was measured, with the mass gain representing the quantity of pyrocarbon deposited within the disk. The results obtained for the five disks 12A, 12B, 12C, 12D, and 12E in the order in which they were stacked from bottom to top, i.e. in the direction of incidence of the gas flow, are given in FIG. 3 in the form of curves I, II, III, and IV corresponding to the first, second, third, and fourth tests respectively.

Curve I shows the size of the deposition gradient between disks 12A which is exposed directly to the impact of the gas flow and disk 12E which is furthest away from said impact.

Curves II, III, and IV show the very great reduction in deposition gradient that results from interposing a permeable wall in accordance with the invention.

Curve IV also shows that interposing a permeable wall makes it possible to perform infiltration at a higher temperature, and thus at a greater deposition rate, without giving rise to any significant deposition gradient.

Although the above description relates to infiltrating pyrocarbon into a felt fiber substrate, the invention is applicable to any kind of porous substrate and any kind of matrix deposited within the substrate. In particular, the matrix may be a ceramic such as silicon carbide.

EXAMPLE 2

A stack of carbon cloth layers having a fiber volume percentage of 40% is placed in a chemical vapor infiltration oven for infiltrating silicon carbide (SiC).

This infiltration operation is performed under conventional conditions as described, for example, in Patent FR 2 401 888.

Deposition takes place for a duration of 96 hours.

After that operation, an examination is performed on a polished metallographic section, and the thickness e of SiC deposited around the fibers is measured at the center of the perform and at the surface thereof.

Under such conditions, performing the prior art gives the following:

e (center) = 19 microns e (surface) = 34 microns giving a ratio of 0.56 between the center and the surface.

The same operation is performed except that in accordance with the invention the preform is placed in a flexible envelope of carbon cloth (G 801 cloth made by Brochier).

The following values are then obtained for the thickness of SiC deposited around the fibers at the center and at the surface of the preform:

e (center) = 17 microns e (surface) = 22 microns giving a ratio of 0.77 between the center and the surface.

It is thus observed that the improvement in the uniformity of the deposit obtained with the method of the invention is independent of the nature of the material obtained by chemical vapor infiltration.

When implementing the method, it would be possible to place a plurality of permeable walls spaced apart from one another and of permeabilities that preferably increase in the gas flow direction.

Finally, it will naturally be understood that the invention is equally applicable to an infiltration installation where the gas flow direction is downwards.

We claim:

1. A chemical vapor infiltration method in which at least one porous substrate having pores accessible to gas flow is placed in an enclosure and comprising the steps of:

injecting a gas flow into the enclosure under conditions of temperature and pressure sufficient to form a solid deposit within said pores accessible to gas flow inside the substrate, throughout the volume of the substrate; and converting the gas flow to a diffusion of the gas at one wall that is permeable to the gas flow and that is interposed on the path thereof between its admission into the enclosure and the substrate, the wall not being in contact with the substrate, thereby establishing, adjacent the substrate, a region of space in which the gas travels essentially under diffusion conditions characterized by a random and not aerodynamic or directed motion of said gas to said substrate, thereby to reduce the deposition gradient in said substrate between a surface of said substrate and its interior.

2. A method according to claim 1, wherein the permeable wall is a fiber material.

3. A method according to claim 1, wherein the permeable wall is a perforated rigid envelope.

4. A method according to claim 3, wherein the rigid envelope is closed at its end facing the incoming gas flow.

5. A method according to claim 1, wherein the permeable wall has a permeability gradient, with its permeability increasing in the gas flow direction.

6. A method according to claim 1, wherein the permeable wall is made of a material selected from: refractory metals, ceramics, and carbon.

* * * * *

UNITED STATES PATENT AND TRADEMARK OFFICE
CERTIFICATE OF CORRECTION

PATENT NO. : 5,217,755
DATED : June 8, 1993
INVENTOR(S) : Jacques Thebault et al.

It is certified that error appears in the above-indentified patent and that said Letters Patent is hereby corrected as shown below:

Column 5, line 44, "perform" should read --preform--.

Signed and Sealed this

Twenty-second Day of February, 1994

Attest:

BRUCE LEHMAN

Attesting Officer         Commissioner of Patents and Trademarks